(12) United States Patent
Lin et al.

(10) Patent No.: US 10,763,296 B2
(45) Date of Patent: Sep. 1, 2020

(54) BIOMETRIC SENSOR AND METHODS THEREOF

(71) Applicant: Taiwan Semiconductor Manufacturing Co., Ltd., Hsinchu (TW)

(72) Inventors: Chin-Min Lin, Hsinchu (TW); Cheng San Chou, Hsin Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/905,391

(22) Filed: Feb. 26, 2018

(65) Prior Publication Data

US 2019/0157337 A1    May 23, 2019

Related U.S. Application Data

(60) Provisional application No. 62/590,055, filed on Nov. 22, 2017.

(51) Int. Cl.
| | |
|---|---|
| *H01L 27/146* | (2006.01) |
| *H01L 31/16* | (2006.01) |
| *G06K 9/00* | (2006.01) |
| *H01L 31/167* | (2006.01) |
| *H01L 27/32* | (2006.01) |
| *H01L 27/15* | (2006.01) |

(52) U.S. Cl.
CPC ......... *H01L 27/14678* (2013.01); *G06K 9/00* (2013.01); *H01L 27/14621* (2013.01); *H01L 27/14623* (2013.01); *H01L 27/14625* (2013.01); *H01L 27/14636* (2013.01); *H01L 27/14685* (2013.01); *H01L 27/3234* (2013.01); *H01L 31/16* (2013.01); *H01L 31/167* (2013.01); *H01L 27/156* (2013.01); *H01L 27/3213* (2013.01); *H01L 27/3244* (2013.01); *H01L 27/3281* (2013.01)

(58) Field of Classification Search
None
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 10,177,194 B2 * | 1/2019 | Lin .................. G06K 9/00013 |
| 10,181,069 B2 * | 1/2019 | Chung ............. G06K 9/00013 |

(Continued)

*Primary Examiner* — Michelle Mandala
(74) *Attorney, Agent, or Firm* — Haynes and Boone, LLP

(57) ABSTRACT

A sensing apparatus is disclosed. The sensing apparatus includes an image sensor; a collimator above the image sensor, the collimator having an array of apertures; an optical filtering layer between the collimator and the image sensor, wherein the optical filtering layer is configured to filter a portion of light transmitted through the array of apertures; and an illumination layer above the collimator.

20 Claims, 10 Drawing Sheets

(56) References Cited

U.S. PATENT DOCUMENTS

| | | |
|---|---|---|
| 2016/0224816 A1 | 8/2016 | Smith et al. |
| 2018/0005005 A1* | 1/2018 | He .................... G06F 3/0412 |
| 2018/0180547 A1* | 6/2018 | Cao .................... C12Q 1/6825 |
| 2018/0367746 A1* | 12/2018 | Toda ................ H04N 5/36965 |

* cited by examiner

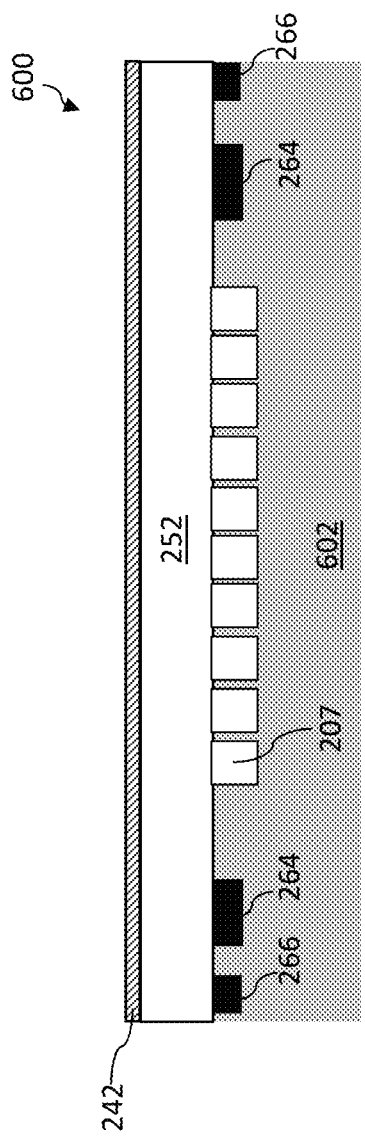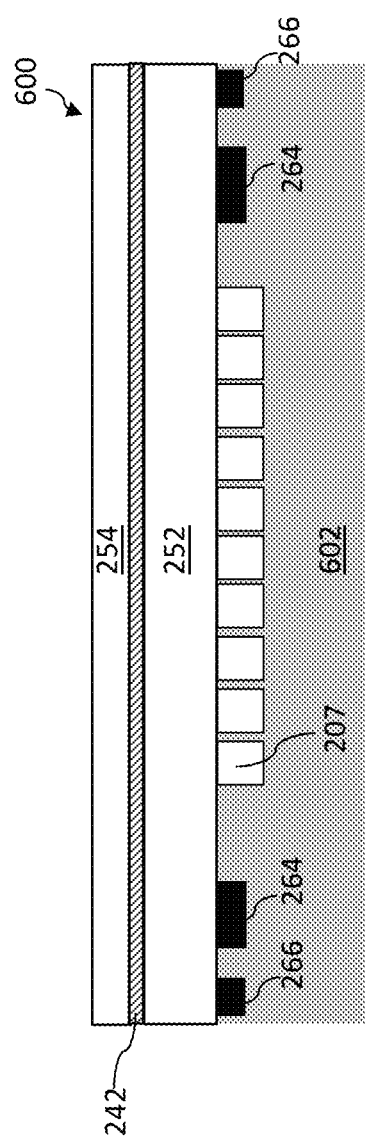

BIOMETRIC SENSOR AND METHODS THEREOF

PRIORITY DATA

This application claims priority to U.S. Provisional Patent Application Ser. No. 62/590,055, filed on Nov. 22, 2017, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, there is considerable interest in providing consumer and/or portable electronic devices (e.g., smart phones, electronic tablets, wearable devices, and so on) with biometric sensors (e.g., optical sensors for fingerprint recognition) inside limited device housing. Surface space is often a particularly limited resource in electronic devices. A need exists for biometric sensors to stack with other components (e.g., display panels) inside device housing to avoid assigning valuable surface space exclusively to biometric sensors that may only be used briefly during a user identification step. By stacking biometric sensors, a biometric object (e.g., a user's finger) outside the electronic device is further distanced away from the sensors. Interferences from stray light and ambient light may grow stronger, resulting in poorer sensitivity of the biometric sensors. For example, fingerprint images acquired by an optical biometric sensor may become blurred due to degradation of signal-to-noise ratio (SNR) of received light under the interferences. Therefore, although conventional means of integrating biometric sensors inside electronic device housing have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6, 7, 8, 9, 10, 11, 12, 13, and 14 are cross-sectional views of an electronic device at various stages of the method of FIG. 5, according to various aspects of the present disclosure.

DETAILED DESCRIPTION

Figure 1:
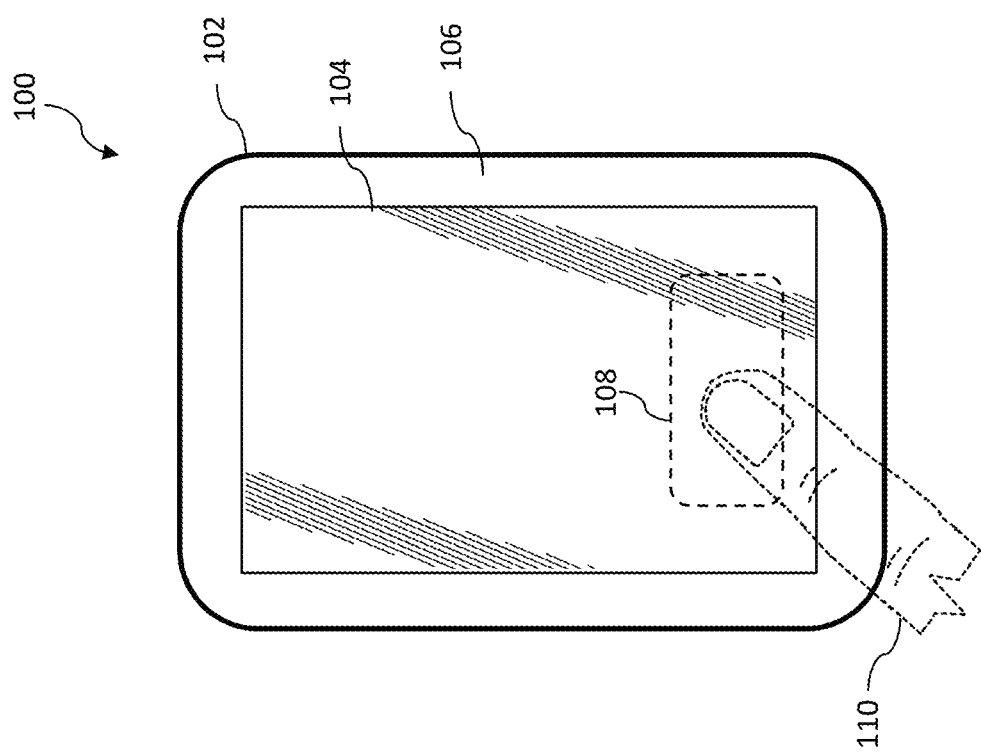
FIG. 1 illustrates an electronic device with a biometric sensing region on surface space, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally related to electronic devices and fabrication. More particularly, some embodiments are related to integrating one or more optical sensors under a display panel of an electronic device for biometric detection. It is an objective of the present disclosure to provide methods for effectively enhancing signal-to-noise ratio (SNR) of incident light received by the optical sensors during a biometric detection.

Biometric sensing systems, such as fingerprint recognition systems, have been one approach drawing considerable interest to provide security features to electronic devices, and more particularly, consumer and/or portable electronic devices (e.g., smart phones, electronic tablets, wearable devices, and so on). Biometric sensing systems are based on unique features of a user and may not rely on memorization or the use of other input devices by the user, such as password input. Biometric sensing systems also provide the advantage of being difficult to hack for the same reason.

Among various biometric sensing techniques, fingerprint recognition is a reliable and widely used technique for personal identification or verification. A fingerprint recognition system generally includes fingerprint sensing and matching functionalities, such as collecting fingerprint images and comparing those images against known fingerprint information. In particular, one approach to fingerprint recognition involves scanning a reference fingerprint and storing the reference image acquired. The characteristics of a new fingerprint may be scanned and compared to the reference image already stored in a database to determine proper identification of a person, such as for verification purposes. A fingerprint recognition system may be particularly advantageous for authentication in consumer and/or portable electronic devices. For example, an optical sensor for acquiring fingerprint images may be carried inside the housing of an electronic device.

The effectiveness of biometric security systems may be affected by the accuracy with which the unique biometric data is able to be detected. In the case of fingerprint recognition systems, this means improving SNR of the incident light arriving optical sensors and thereby enhancing resolution of the images acquired.

Meanwhile, the availability of space within the device housing weights much during design efforts to integrate biometric security systems. Many electronic components contend for this space. Available surface space is often a particularly limited resource. In various embodiments, an electronic device includes a display panel and a separate fingerprint sensor located adjacent to the display panel. By placing the fingerprint sensor in adjacent areas, the fingerprint sensor avoids being obstructed by the display panel and will receive stronger incident lights. However, by assigning this valuable portion of the surface space exclusively to the fingerprint sensor, the display panel has to shrink to accommodate the fingerprint sensor, instead of expanding to substantially the whole surface space of the electronic device (e.g., for a better user viewing experience).

Referring initially to FIG. 1, an electronic device 100 is now described. The electronic device 100 is illustratively a mobile wireless communication device (e.g., a smart phone). The electronic device 100 may be any other suitable electronic device, such as a laptop computer, an electronic tablet, a portable gaming device, a navigation device, or a wearable device. The electronic device 100 includes a housing 102 together with other components, such as processor(s) and memories, inside the housing 102.

A display panel 104 is also carried by the housing 102. In the illustrated embodiment, the display panel 104 is an organic light-emitting diode (OLED) display panel. In various embodiments, the display panel 104 may be any other suitable type display panel, as will be appreciated by those skilled in the art, such as liquid-crystal display (LCD) panel, light-emitting diode (LED) display panel, or active-matrix organic light-emitting diode (AMOLED) display panel.

In the illustrated embodiment, the display panel 104 expands substantially to the whole surface space of the electronic device 100. Some margins between the display panel 104 and edges of the housing 102 may be left for bezel panels 106. The display panel 104 stacks above image sensing features for fingerprint detection, or other suitable biometric sensing features. The image sensing features will be described further in details later. The display panel 104 acts as both a display and an input device through which the image sensing features acquires fingerprint images. As such, the display panel 104 performs multiple device functions in response to user input. For example, the display panel 104 may first display a prompt (e.g., a finger icon or an instruction text) on screen when the electronic device 100 is in a lock status. The display panel 104 may further highlight a sensing region 108. When a user's finger 110 or another suitable object is placed inside the sensing region 108, in either near field or in direct contact with the display panel 104, the image sensing features are activated and acquire biometric data (e.g., a fingerprint image) from the user's finger 110. Such biometric data is sent to processor(s) for matching and/or spoof detection. If the biometric data matches a reference fingerprint image stored in memories, the electronic device 100 may thereafter transit into an unlock status, and the display panel 104 starts to show desktop icons or response to various other user inputs. The display panel 104 may further integrate with touch sensor arrays. In such case, the display panel 104 is also a touch display panel.

Figure 2:
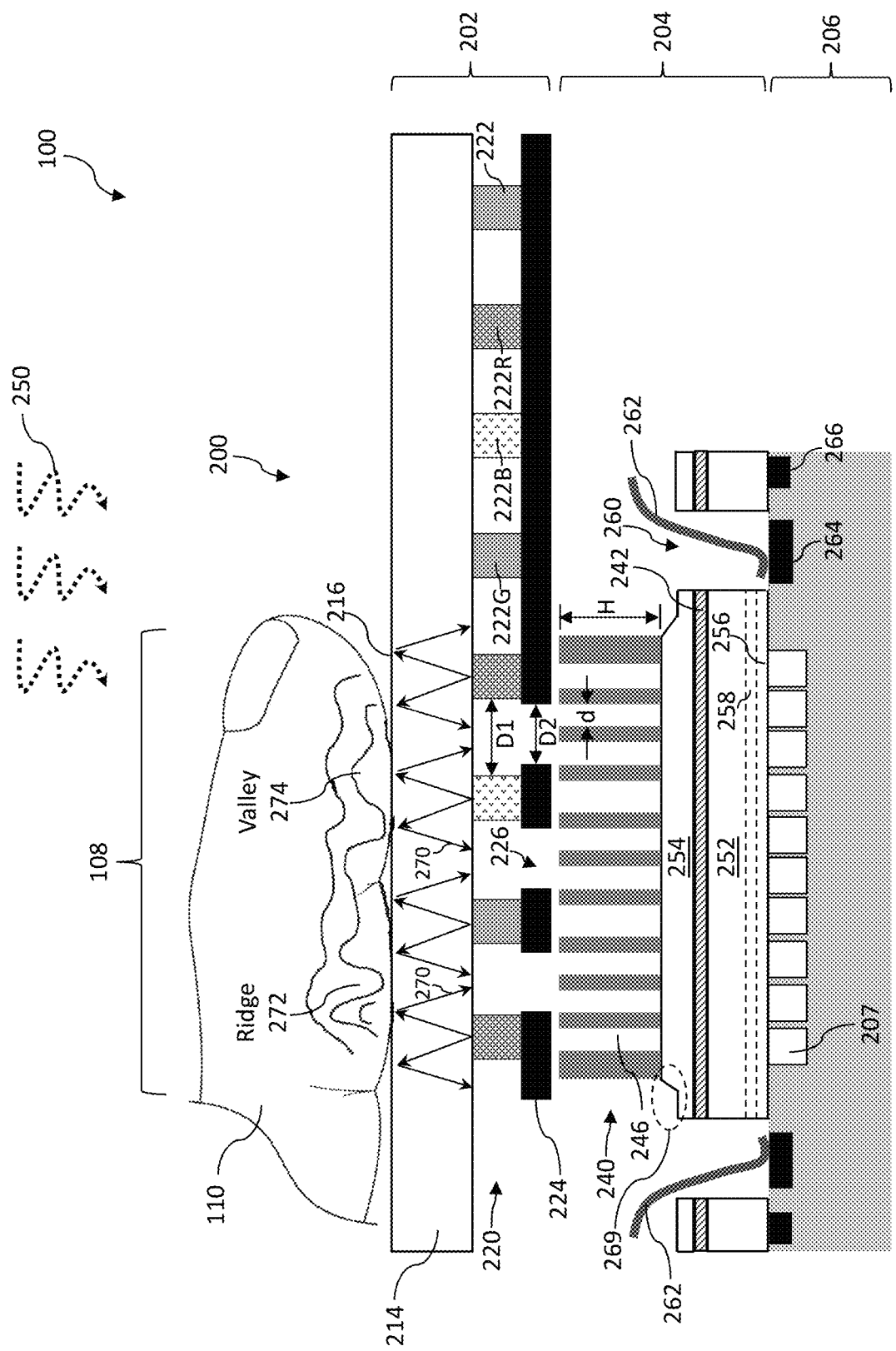
FIG. 2 is a cross-sectional view of an electronic device integrated with an optical sensor under a display panel, according to various aspects of the present disclosure.

Referring to FIG. 2, a cross-sectional view of a portion of the electronic device 100 is illustrated. This portion of the electronic device 100 carries the fingerprint recognition function and can be regarded as a fingerprint recognition system 200. The fingerprint recognition system 200 is in a stack-up configuration, including a display panel 202 on the top, a light conditioning layer 204 in the middle, and an image sensing layer 206 at the bottom. The display panel 202 illuminates the sensing region 108 above. When light emitted from the display panel 202 is reflected from the user's finger 110 or other suitable objects, the reflected light travels downwardly through the display panel 202 and the light conditioning layer 204 and eventually arrives at the image sensing layer 206. The image sensing layer 206 includes one or more optical sensing elements 207, such as complementary metal oxide semiconductor (CMOS) sensors and/or charged coupled device (CCD) sensors. The optical sensing elements 207 are capable of detecting intensities of the incident light. The image sensing layer 206 thereby convers the incident light into a pixel image, which includes biometric characteristics of the user's finger 110. Each pixel of the pixel image may correspond to intensity of the incident light recorded at a corresponding location of an optical sensing element 207.

In some embodiments, the display panel 202 includes a cover glass 214 (or cover lens) that protects inner components of the electronic device 100. The sensing region 108 is defined above the cover glass 214. A top surface 216 of the cover glass 214 forms a sensing surface, which provides a contact area for the user's finger 110 or other suitable objects. Inside the sensing region 108, the user's finger 110 may directly touch the top surface 216 or keep a small distance away from the top surface 216 as during a near field sensing. The cover glass 214 may be made of glass, transparent polymeric materials, or other suitable materials.

The display panel 202 includes a display layer 220 under the cover glass 214. The display layer 220 includes an array of light emitting pixels 222. Different light emitting pixels 222 may be configured to emit different colors, such as the ones emitting red light (denoted as 222R), the ones emitting green light (denoted as 222G), or the ones emitting blue light (denoted as 222B). Due to geometry relationships with the sensing region 108, the light emitting pixels 222 can be categorized into two groups, one group directly under the sensing region 108 and another group outside of the sensing region 108. The light emitting pixels 222 outside of the sensing region 108 perform regular display functions, while the light emitting pixels 222 directly under the sensing region 108 perform both regular display functions and illumination function during biometric sensing, depending on applications. In various embodiments, pixel distance $D_1$ between adjacent light emitting pixels 222 is in a range from about 5 um to about 30 um. In a specific example, the pixel distance $D_1$ may be in a range from about 10 um to about 20 um.

In some embodiments, the display panel 202 further includes a blocking layer 224. The blocking layer 224 is a semitransparent or opaque layer that may be disposed below the display layer 220. Outside of the sensing region 108, the blocking layer 224 is continuous, obscuring components under the display layer 220 from the light emitted by the light emitting pixels 222 and from ambient light. Directly under the sensing region 108, the blocking layer 224 has a plurality of openings 226. Each opening 226 locates between two adjacent light emitting pixels 222. The openings 226 allow the light reflected from the sensing region 108 to travel through. In the illustrated embodiment, there is one opening 226 located between two adjacent light emitting pixels 222. The opening 226 may have a width (or diameter) $D_2$ in a ratio to the pixel distance $D_1$ from about 40% to about 90%. In some other embodiments, there are two or more openings 226 located between two adjacent light emitting pixels 222. The opening 226 may thus have a width (or diameter) $D_2$ in a ratio to the pixel distance $D_1$ from about 20% to about 40%.

In various embodiments, the display layer 220 may be a LCD display (using backlight with color filters to form RGB pixels), a LED display (e.g., a microLED, in which the pixel material can be inorganic material used in LED), an OLED display, or any other suitable displays. In the illustrated embodiment, the light emitting pixels 222 are organic light emitting diodes (OLED) and the display layer 220 is an OLED display. Examples of an OLED display may include active-matrix OLED (AMOLED), passive-matrix OLED (PMOLED), white OLED (WOLED), and RBG-OLED, and/or other suitable types of OLED. An OLED display is usually thinner, lighter, and more flexible than other types of displays, such as LCD or LED displays. OLED display does not require a back light, since the light can be generated from the organic light emitting material in an OLED, which allows a pixel to be turned completely off. The organic light emitting material can be an organic polymer, such as polyphenylenevinylene and polyfluorene. Due to the organic light emitting material producing its own light, the OLED display can also have a wider viewing angle. This can be in comparison to a LCD display, which works by blocking light that can lead to obstruction of certain viewing angles.

The OLED diodes emit light using a process called electroluminescence. Electroluminescence is a phenomenon where the organic light emitting material can emit light in response to an electric current passing through. In some examples, the OLED diodes can include hole injection layers, hole transport layers, electron injection layers, emissive layers, and electron transport layers. The color of light emitted by an OLED diode depends on the type of organic light emitting material used in the emissive layer. Different colors can be obtained with a variety of chemical structures of the organic light emitting material. For example, the light emitting pixel 222R can be formed with an organic light emitting material that emits red light; the light emitting pixel 222G can be formed with an organic light emitting material that emits green light; and the light emitting pixel 222B can be formed with an organic light emitting material that emits blue light. The intensity of light can depend on the number of emitted photons or the voltage applied on the OLED diodes. In some embodiments, each light emitting pixel 222R, 222G, or 222B is formed with the same organic light emitting material that generates white light, but further includes a red, green, or blue color filter to filter out colors other than the target color, respectively. The color filter can be formed using a cholesteric filter material such as a multilayer dielectric stack that includes materials with different indices of refraction configured to form an optical filter.

Figure 3B:
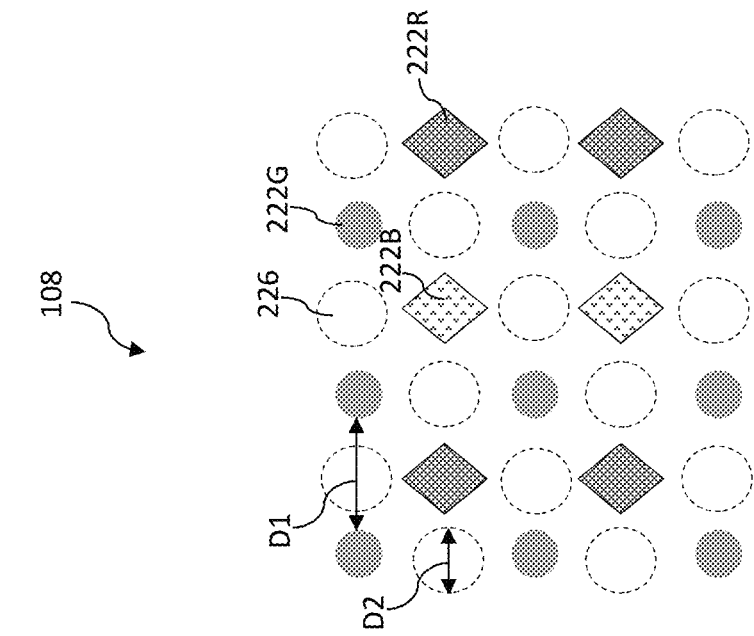
FIGS. 3A and 3B are top views of a biometric sensing region of an electronic device integrated with an optical sensor under a display panel, according to various aspects of the present disclosure.
Figure 3A:
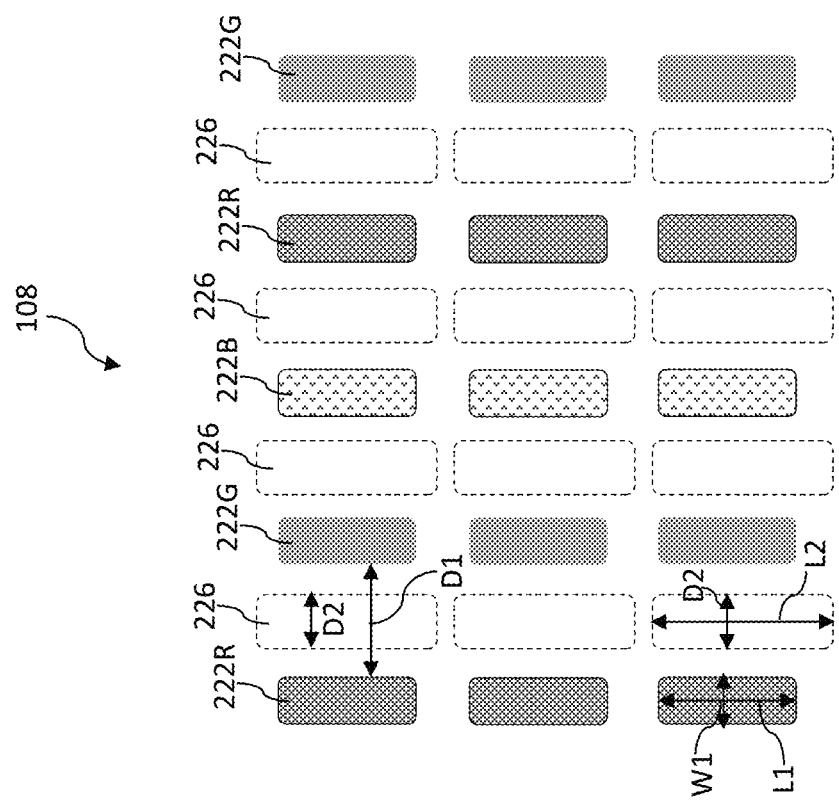

FIGS. 3A and 3B illustrate two exemplary arrangements of light emitting pixels 222 and openings 226 from a top view of the sensing region 108. In FIG. 3A, each light emitting pixel 222R, 222G, or 222B has approximately the same shape and dimensions, for example, a rounded corner rectangular shape with aspect ratio (height $L_1$/width $W_1$) ranging from about 2:1 to about 8:1. The light emitting pixels 222R, 22G, and 222B form an N×M array. Each column of the array includes light emitting pixels with the same color. For example, as illustrated in the FIG. 3A, the leftmost column includes only red light emitting pixels (222R); the second column to the left includes only green light emitting pixels (222G); the third column to the left includes only blue light emitting pixels (222B); and so on. Such light emitting pixel arrangement is also referred to as an R-G-B stripe arrangement. Other stripe arrangements, such as R-B-G-G-B-R stripe arrangement or R-R-G-G-B-B stripe arrangement, may also be suitable for the display layer 220. In some embodiments, the display layer 220 may have more than three primaries colors, such as a combination of red, green, blue, and yellow (RGBY) or a combination of red, green, blue, yellow, and cyan (RGBYC). The light emitting pixel arrangement may respectively be R-G-B-Y strip arrangement or R-G-B-Y-C strip arrangement, or any other suitable strip arrangement. In the display layer 220, there may be substantially the same amount of light emitting pixels under each color.

As illustrated in the FIG. 3A, one or more columns of the openings 226 locate between two adjacent columns of the light emitting pixels 222. The width $D_2$ of the opening 226 may be smaller or larger than the width $W_1$ of the light emitting pixel 222. In some embodiments, the width $D_2$ is substantially the same as the width $W_1$. Similarly, the length $L_2$ of the opening 226 may be smaller or larger than the length $L_1$ of the light emitting pixel 222. In some embodiments, the length $L_2$ is substantially the same as the length $L_1$. In one example, the opening 226 has substantially the same shape and dimensions with the light emitting pixel 222. In another example, the opening 226 is about 20% longer than the light emitting pixel 222, while about 10% narrower. This dimension arrangement is merely illustrative, and is not intended as limiting. Numerous alternative exemplary dimension arrangements exist for the light emitting pixels 222 and the openings 226.

In FIG. 3B, the display layer 220 has as twice as many green light emitting pixels 222G as there are blue light emitting pixels 222B or red light emitting pixels 222R. The green light emitting pixels 222G are in round or oval shape and smaller, while the red and blue ones are in diamond shape and larger. In some embodiments, the blue light emitting pixel 222B is even larger than the red emitting pixel 222R. Such light emitting pixel arraignment takes advantages of the usually most efficient and longest lasting lifetime of the green light emitting pixels 222G and balances the usually shortest lifetime of the blue emitting pixels 222B. The openings 226 are not group in columns but interleaved among the light emitting pixels 222. The opening 226 may be in a round shape with a diameter $D_2$. In some embodiments, the opening 226 is smaller than the green light emitting pixel 222G. In some embodiments, the opening 226 is larger than the green light emitting pixel 222G but smaller than the blue light emitting pixel 222B or the red light emitting pixel 222R.

Referring back to FIG. 2, under the sensing region 108, the light conditioning layer 204 is stacked under the display panel 202. The light conditioning layer 204 includes a collimator 240 and an optical filtering film 242. The collimator 240 includes an array of apertures 246. Each aperture 246 is directly above one or more optical sensing elements 207 in the image sensing layer 206. The array of apertures 246 is formed by any suitable techniques, such as plasma etching, laser drilling, or the like. The array of apertures 246 conditions incident light reflected from the sensing region 108. With the image sensing layer 206 stacked at the bottom, the display panel 202, especially the relative thick cover glass 214, adds extra vertical distance between the user's finger 110 and the image sensing layer 206, which causes stray light from nearby regions of the user's finger 110 also arrives an optical sensing element 207 together with the light from a small spot directly above. The stray light contributes to image blurring. The array of apertures 246 helps filtering out the stray light and substantially only allows the light from the small spot directly above to be detected, resulting in sharper images.

A metric of the collimator 240 is an aspect ratio of the aperture 246, defined as the height H divided by the diameter d of the aperture 246. The aspect ratio of the aperture 246 is sufficiently large to allow light rays at normal or near normal incidence to the collimator 240 to pass and reach the optical sensing element 207. Examples of suitable aspect ratio of the aperture 246 are ranging from about 5:1 to about 50:1 and sometimes ranging from about 10:1 to about 15:1. In an embodiment, the height H of the aperture 246 is in a range from about 30 um to 300 um, such as about 150 um. In various embodiments, the collimator 240 may be an opaque layer with array of holes. In some embodiments, the collimator 240 is a monolithic semiconductor layer, such as a silicon layer. Other examples of the collimator 240 may include plastics such as polycarbonate, PET, polyimide, carbon black, inorganic insulating or metallic materials, or SU-8.

Still referring to FIG. 2, the light conditioning layer 204 also includes the optical filtering film 242. The optical filtering film 242 selectively absorbs or reflects certain spectrums of incident light, especially components from the ambient light 250, such as infrared light and/or a portion of other visible light (e.g., red light). The optical filtering film 242 helps reducing the optical sensing element 207's sensitivity to ambient light 250 and increasing its sensitivity to the light emitted from the light emitting pixels 222. In an example, the optical filtering film 242 may include a thin metal layer or a metal oxide layer that absorbs or reflects light in certain spectrums. In another example, the optical filtering film 242 may include dye(s) and/or pigment(s) that absorb or reflect certain light components. Alternatively, the optical filtering film 242 may include several sub-layers or nano-sized features designed to cause interference with certain wavelengths of incident light. The optical filtering film 242 may be deposited on a dielectric layer 252. Optionally, there may be a capping layer 254 protecting the optical filtering film 242. In the illustrated embodiment, the optical filtering film 242 is a continuous film under the collimator 240. In some embodiments, the optical filtering film 242 is disposed between the display panel 202 and the collimator 240, such as between the blocking layer 224 and the collimator 240. In some embodiments, the optical filtering film 242 can be disposed between the display layer 220 and the blocking layer 224.

The ambient light 250, such as sun light, may include abundant infrared light components, which can penetrate the user's finger 110 or other objects in the sensing region 108 and arrive the optical sensing elements 207. In contrast to human eyes, CMOS and CCD image sensors are usually also sensitive to infrared light (including near infrared light). The infrared light penetrating the user's finger 110 does not carry biometric information, which reduces contrasts of the useful reflected light emitted from the light emitting pixels 222. Such infrared light can be considered as a source of noise in the pixel image generated by the image sensing layer 206. Therefore, SNR of the incident light is reduced due to the unwanted infrared light. When ambient light 250 becomes stronger, the infrared light may even saturate the optical sensing elements 207 and SNR may be below a threshold for any meaningful biometric detection. For example, the biometric detection function may fail when the electronic device is under strong sunlight. In some embodiments, the optical filtering film 242 is an infrared light (IR) filter, also known as an infrared light cut-off filter (IRCF), such that infrared light can be substantially blocked, while visible light emitted from the light emitting pixels 222 can transmit through the IRCF filter.

The dielectric layer 252 may include a single or multiple material layers. In some embodiments, the dielectric layer 252 includes an anti-reflection (AR) film 256 deposited at the bottom. In some embodiments, the dielectric layer 252 further includes a red light reduction film 258 stacked above the AR film 256. The red light reduction film 258 weakens intensity of red light components in the incident light. Compared to light in other colors, red light is easier to diffract from the optical sensing elements 207 and cause a secondary red image known as a ghost image. The red light reduction film 258 may help suppressing the ghost image.

The stack of the dielectric layer 252, the optical filtering film 242, and the capping layer 254 may further have a few openings 260. The openings 260 allow bondwires 262 to interconnect the bondpads 264 on the top surface of the image sensing layer 206 to external circuits, such as a processor of the electronic device 100. The bondpads 264 route to control signal lines and power/ground lines embedded in the image sensing layer 206. The image sensing layer 206 may further include alignment marks 266 on the top surface for alignment control during fabrication and assembly. The sidewall of the capping layer 254 adjacent to the opening 260 may have a notched corner 269. The reason a notched corner 269 exists will be explained in details later on.

Figure 4:
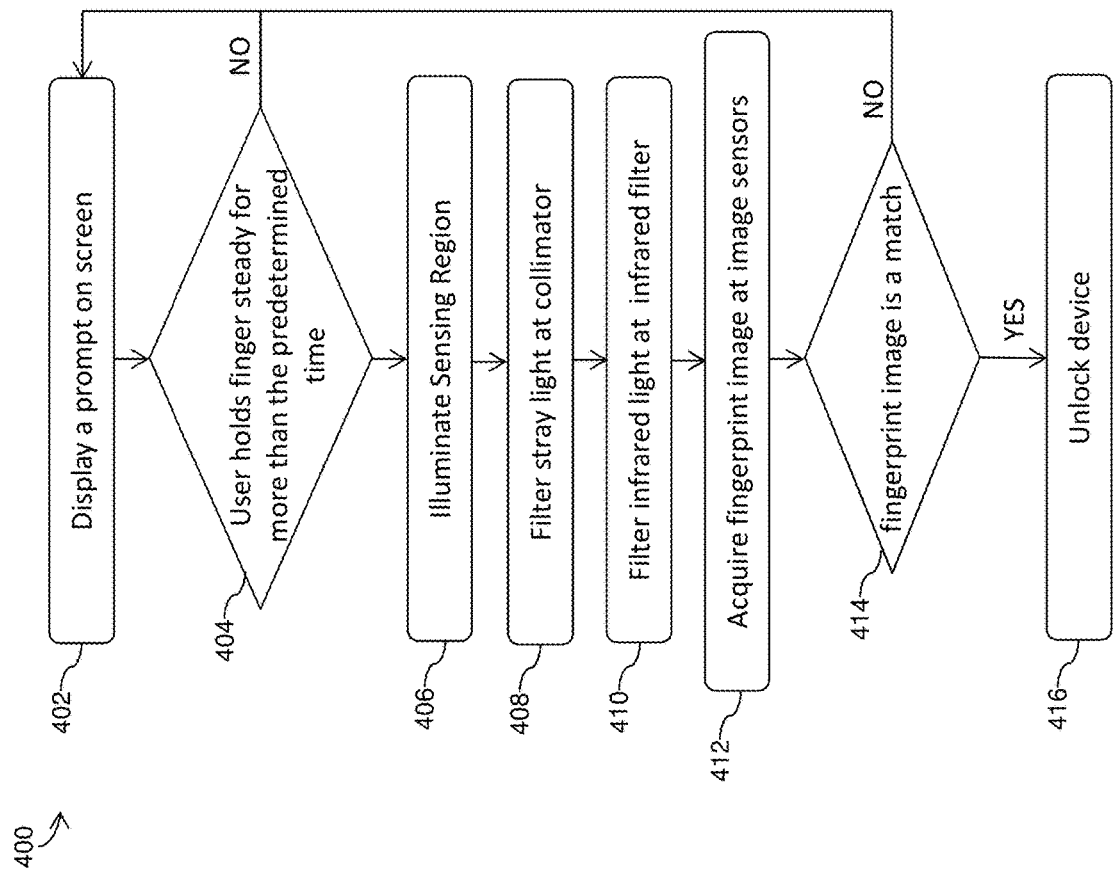
FIG. 4 illustrates a flowchart of a method for capturing biometric images, according to various aspects of the present disclosure.

FIG. 4 shows a flowchart of a method 400 for capturing a biometric image from an input object illuminated by a display panel integrated with a light conditioning layer, according to examples of the disclosure. The method 400 will be described below with references to the exemplary electronic device 100 illustrated in FIG. 2.

At block 402, the method 400 begins with displaying a prompt on the screen. The screen of the electronic device 100 may be in a lock status. The prompt may be an icon, such as a fingerprint icon or an instruction text. The prompt highlights a sensing region 108 on the screen. The prompt is shown by light emitting pixels 222 under the sensing region 208. The light emitting pixels 222 can be OLED diodes. The light emitting pixels 222 outside of the sensing region 108 may be turned off in the lock status or display preset screen saver images.

At block 404, the method 400 detects an input object shown up in the sensing region 108, such as the user's finger 110. The detection may be implemented by sensing the incident light variation at the optical sensing elements 207. Alternatively, the display panel 202 may be a touch screen and include touch sensor(s), and the detection may be implemented by the touch sensor(s). In some applications, the user's finger 110 is not necessary to physically touch the top surface 216 of the display panel 202. Instead, a near-field imaging can be used for sensing touches detected through a user's glove or other barriers such as oils, gels, and moisture. When the user's finger 110 stays steady for more than a predetermined time, such as the user holding a finger steady for about one hundred milliseconds, the method 400 enters a biometric detection mode. Otherwise, the method 400 returns to block 402, waiting for a new user input.

At block 406, the prompt shown on the screen is turned off and the light emitting pixels 222 under the sensing region 208 start to illuminate the user's finger 110. The light 270 emitted from the light emitting pixels 222 travels through the cover glass 214 and arrives at the user's finger 110. The user's finger 110 can include ridges 272 and valleys 274. The ridges 272 of the finger can reflect more light due to a closer distance to the top surface 216 than the valleys 274, and the valleys 274 can reflect less light. The light 270 is in turn reflected back towards the light conditioning layer 204.

At block 408, method 400 filters stray light components in the light 270 at the collimator 240. With high aspect ratio of the apertures 246, the collimator 240 only allows light rays reflected from the sensing region 108 at normal or near normal incidence to the collimator 240 to pass and eventually reach the image sensing layer 206. The optical sensing element 207 can be used to measure the intensity of light and convert the measured intensity into pixel image of the input object, such as the user's finger 110. On the other hand, stray light with a larger angle from normal, strike the collimator 240, either on its top surface or at surface within the apertures 246 (e.g., aperture sidewalls) and are blocked and prevented from reaching the image sensing layer 206 below. The aspect ratio of the apertures 246 is sufficiently large to prevent stray light from traveling through the collimator 240, such as from about 5:1 to about 50:1. As an example, a light ray reflected from the valley 274 may travel in a large angel to norm direction and arrive at one sensor element directly under the ridge 272 in the absence of the collimator 240. The image produced by the one sensor element is therefore blurred due to mixing the lights from regions of the ridge 272 and the valley 274. Such a light ray is referred to as stray light. Larger aspect ratios of the apertures 246 restrict the light acceptance cone to smaller angles, improving the optical resolution of the system. In some embodiments, the apertures 246 are cylindrical or conical in shape. The sidewalls of the apertures 246 may further include grooves or other structures to prevent stray light from reflecting off the walls and reaching the image sensing layer 206 below.

At block 410, the method 400 filters certain spectrums of light at the optical filtering film 242. In some embodiments, the optical filtering film 242 is an infrared light cut-off filter, which filters (or reduces) infrared light component from the incident light, such as by absorbing or reflecting. The ambient light 250, such as sunlight, is the major source of infrared light. The infrared light may easily penetrate the user's finger 110. Thus the infrared light does not carry useful information of biometric characteristics of the finger and can be considered as part of the noise. Blending the infrared light component from the ambient light with the reflected light from the light emitting pixels reduces the sensitivity of the optical sensing elements 207. By filtering the infrared light before sensing, SNR of the incident light will be increased. In some other embodiments, the optical filtering film 242 may target light in certain spectrums other than infrared light, for example, red light in the visible spectrum or ultra violet light. The light filtering profile of the optical filtering film 242 may be formulated to give a particular appearance of color, texture, or reflective quality thereby allowing for optimized filtering performance. In some embodiments, the optical filtering film 242 is an infrared light cut-off filter and there is a separate film stacked under or above for filtering red light to reduce ghost image.

At block 412, the method 400 acquires a fingerprint image at the image sensing layer 206. The optical sensing elements 207 inside the image sensing layer 206 convert the incident light into electrical outputs. Each optical sensing element 207's output may correspond to one pixel in the fingerprint image. The optical sensing elements 207 may comprise color image sensors and/or monochromatic image sensors. In some embodiments, each of the optical sensing elements 207 may be configured to correspond with specific light wavelengths, such as a sensor element under a red light emitting pixel 222R for sensing a red light wavelength, a sensor element under a green light emitting pixel 222G for sensing a green light wavelength, and a sensor element under a blue light emitting pixel 222B for sensing a blue light wavelength.

At block 414, the method 400 compares the acquired fingerprint image with an authentic reference image previously stored in a memory. If the fingerprint images match, the method 400 proceeds to block 416 to unlock the screen. The light emitting pixels 222 under the sensing region 108 will stop illumination and join the other light emitting pixels 222 outside of the sensing region 108 to start display regular desktop icons as in an unlock status. If the fingerprint images do not match, the method 400 proceeds back to block 402 to wait for new biometric detection.

Figure 5:
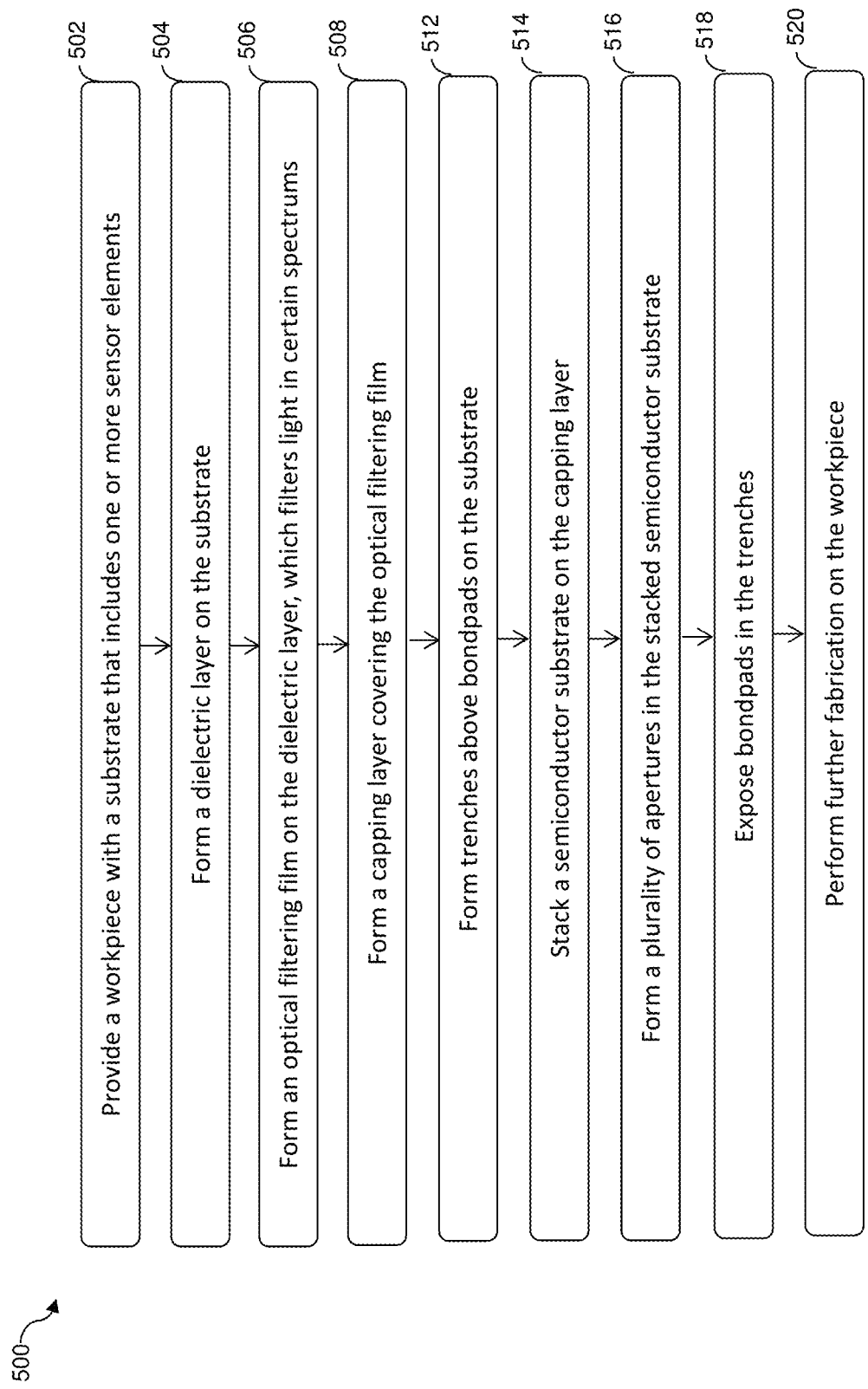
FIG. 5 illustrates a flowchart of a method for fabricating an electronic device integrated with an optical sensor under a display panel, according to various aspects of the present disclosure.

FIG. 5 is a flowchart of a method 500 of fabricating a workpiece 600 with a biometric sensing system. The workpiece 600 may be substantially similar to the electronic device 100 of FIG. 2 in many regards. Additional steps can be provided before, during, and after the method 500, and some of the steps described can be replaced or eliminated for other embodiments of the method 500. The method 500 is described below in conjunction with FIGS. 6-14. FIGS. 6-14 show cross-sectional views of the workpiece 600 at various stages of the method 500 according to various aspects of the present disclosure.

Figure 6:
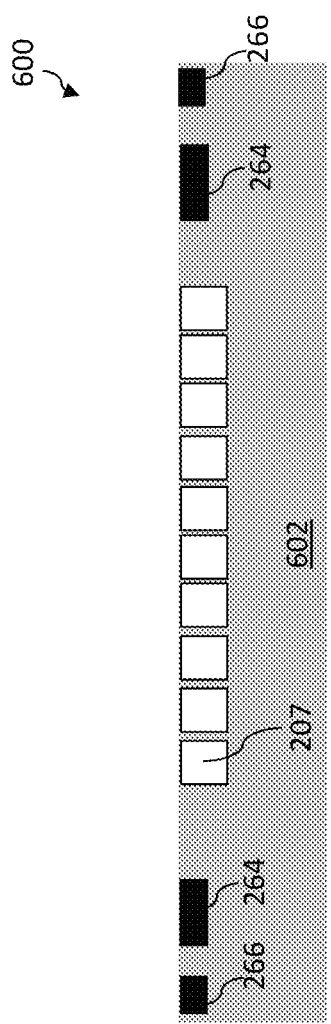

Referring first to block 502 of FIG. 5 and to FIG. 6, a workpiece 600 is received that includes a semiconductor substrate 602. In various examples, the semiconductor substrate 602 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The workpiece 600 also includes one or more optical sensing elements 207. In one embodiment, the optical sensing elements 207 may be disposed over the front surface and extended into the semiconductor substrate 602. The optical sensing elements 207 each may comprise a light-sensing region (or photo-sensing region) which may be a doped region having n-type and/or p-type dopants formed in the semiconductor substrate 602 by a method such as diffusion or ion implantation. The optical sensing elements 207 may include photodiodes, pinned layer photodiodes, non-pinned layer photodiodes, reset transistors, source follower transistors, transfer transistors, select transistors, complimentary metal-oxide-semiconductor (CMOS) image sensors, charged coupling device (CCD) sensors, active pixel sensors, passive pixel sensors, and/or other sensors diffused or otherwise formed in the semiconductor substrate 602. The optical sensing elements 207 may comprise a plurality of sensor pixels disposed in a sensor array or other proper configuration. The plurality of sensor pixels may be designed having various sensor types. For example, one group of sensor pixels may be CMOS image sensors and another group of sensor pixels may be passive sensors. Moreover, the optical sensing elements 207 may comprise color image sensors and/or monochromatic image sensors.

Additional circuitry and input/outputs are typically provided adjacent to the optical sensing elements 207 for providing an operation environment for the optical sensing elements 207 and for supporting external communications with processors. For example, the optical sensing elements 207 may further comprise or be coupled to components such as an electric circuit so that the optical sensing elements 207 are operable to provide a proper response to incident light. A plurality of dielectric layers and a plurality of conductive features including a plurality of metal structures coupled to a plurality of contact and/or via structures may be also formed over the front surface of the substrate. The plurality of metal structures and the plurality of contact/via structures may be formed in an integrated process, such as a damascene process or a dual damascene process, and further, vertical and horizontal features may be formed in various processes, such as photolithography and etching processes. The plurality of metal structures may be routed to one or more bondpads 264. The bondpads 264 may be disposed on the front surface of the semiconductor substrate 602. The bondpads 264 provide landing areas for bondwires, which provide external connections to the plurality of metal structures, such as connections of power supply, ground, controls, and data lines. The workpiece 600 may further include other features, such as alignment marks 266. The alignment marks 266 may be disposed on the top surface of the semiconductor substrate 602. Alignment marks and the alignment of subsequent lithographic patterns with respect to those marks are an important part of the semiconductor manufacturing process. Alignment of one pattern layer to previous layers is typically done with the assistance of special alignment patterns designed on a previous mask layer. When these special patterns are aligned, it is assumed that the remainder of the circuit patterns is also correctly aligned.

Figure 7:
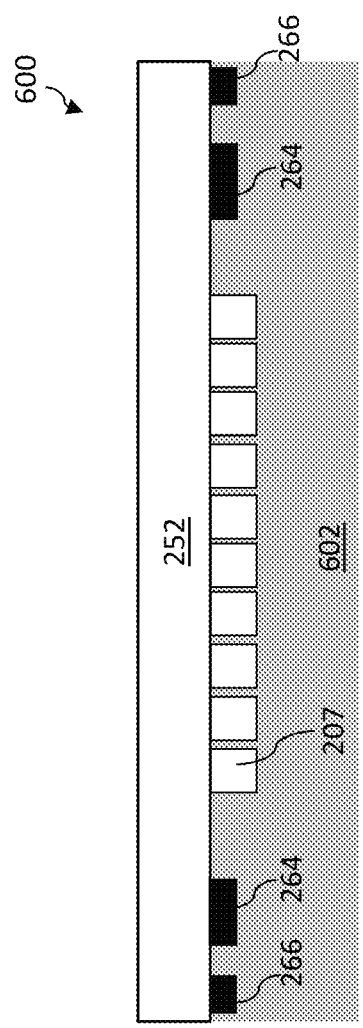

Referring to block 504 of FIG. 5 and to FIG. 7, the method 500 deposits a dielectric layer 252 covering the workpiece 600. The dielectric layer 252 may include material composition such as silicon oxide, silicon nitride, silicon oxynitride, and/or silicon carbide. In an exemplary embodiment, the dielectric layer 252 includes silicon oxide. The dielectric layer 252 may be formed to any suitable thickness and by any suitable process including thermal growth, chemical vapor deposition (CVD), high-density plasma CVD (HDP-CVD), physical vapor deposition (PVD), atomic-layer deposition (ALD), and/or other suitable deposition processes. The dielectric layer 252 may be uniform in composition or may include various layers, such as a red light reduction film and/or an anti-reflection (AR) film at the bottom. The thickness of the dielectric layer 252 may be in a range of about 1 µm to about 10 µm, such as about 2 um.

Referring to block 506 of FIG. 5 and to FIG. 8, the method 500 deposits an optical filtering film 242 covering the workpiece 600. The optical filtering film 242 selectively absorbs or reflects certain spectrums of incident light. In the illustrated embodiment, the optical filtering film 242 filters infrared light. The optical filtering film 242 may be uniform in composition or may include various layers. The optical filtering film 242 may include metal, metal oxide, dyes, and/or pigments. In one embodiment, the optical filtering film 242 includes Tatanlum dioxide. In another embodiment, the optical filtering film 242 includes silicon nitride. The optical filtering film 242 may be formed to any suitable thickness and by any suitable process including chemical vapor deposition (CVD), high-density plasma CVD (HDP-CVD), physical vapor deposition (PVD), atomic-layer deposition (ALD), and/or other suitable deposition processes. The thickness of the optical filtering film 242 may be in a range of about 2 um to about 8 um, such as about 4 um.

Referring to block 508 of FIG. 5 and to FIG. 9, the method 500 may optionally deposits a capping layer 254 covering the workpiece 600. The capping layer 254 protects the optical filtering film 242 underneath from subsequent fabrication processes. The capping layer 254 may include a dielectric such as a silicon oxide, a silicon nitride, a silicon oxynitride, and/or a silicon carbide. In various embodiments, the capping layer 254 and the dielectric layer 252 may include same or different material compositions. In an exemplary embodiment, the capping layer 254 includes silicon nitride and the dielectric layer 252 includes silicon oxide. The capping layer 254 may be formed to any suitable thickness and by any suitable process including thermal growth, chemical vapor deposition (CVD), high-density plasma CVD (HDP-CVD), physical vapor deposition (PVD), atomic-layer deposition (ALD), and/or other suitable deposition processes. The thickness of the capping layer 254 may be in a range of about 0.1 um to about 2 um, such as about 0.5 um.

Figure 10:
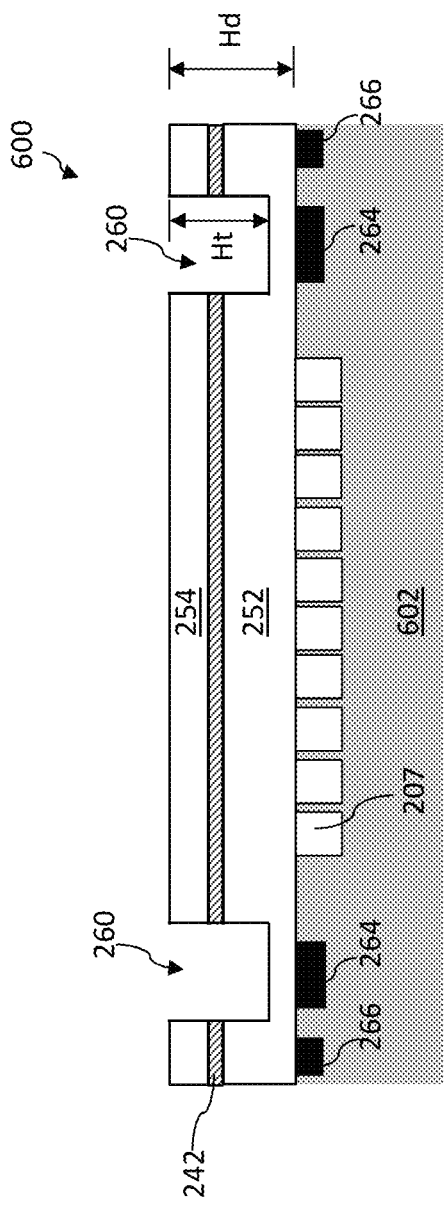

Referring to block 512 of FIG. 5 and to FIG. 10, the method 500 forms trenches 260 directly above the bondpads 264. The bondpads 264 are not exposed in the trenches 260, as a layer of the dielectric layer 252 at the bottom of the trenches 260 remains covering the bondpads 264, which protects the bondpads 264 from subsequent fabrication processes. Block 512 may include a variety of processes such as photolithography and etching to form the trenches 260. The photolithography process may include forming a photoresist (not shown) over the workpiece 600. An exemplary photoresist includes a photosensitive material sensitive to radiation such as UV light, deep ultraviolet (DUV) radiation, and/or EUV radiation. A lithographic exposure is performed on the workpiece 600 that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. After the photoresist is developed, the exposed portions of the workpiece 600 may be removed by an etching process, such as wet etching, dry etching, Reactive Ion Etching (RIE), ashing, and/or other etching methods. After etching, the photoresist may be removed. In some embodiments, inside the trench 260, the etching process removes the capping layer 254, the optical filtering film 242, and upper portions of the dielectric layer 252. The depth $H_1$ of the trench 260 may be in a ratio of the total thickness $H_d$ of the capping layer 254, the optical filtering film 242, and the dielectric layer 252, ranging from about 40% to about 90%, such as about 50% in one example. In some embodiments, the material compositions of the dielectric layer 252 are different from the capping layer 254 and the optical filtering film 242. By selecting an etchant or etchants that target material compositions of the capping layer 254 and the optical filtering film 242 while resist etching of the dielectric layer 252, the dielectric layer 252 functions as an etching stop layer and substantially remains covering the bondpads 264.

Figure 11:
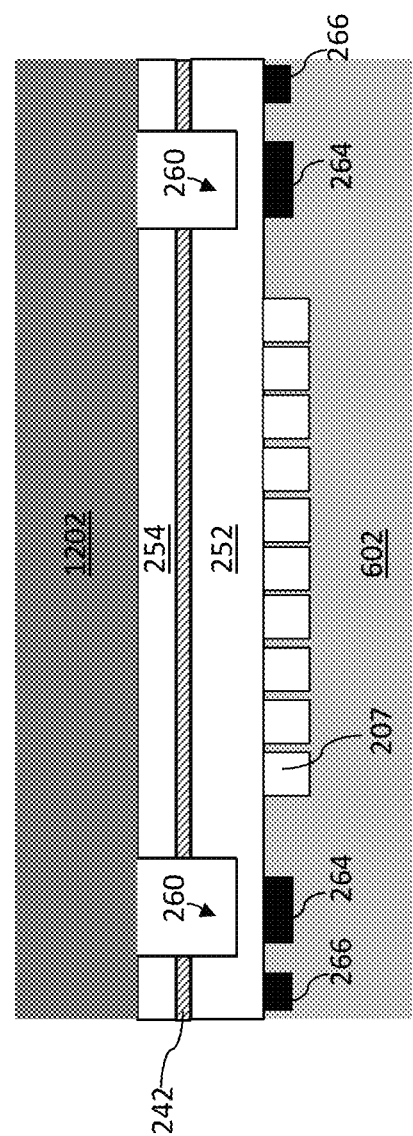

Referring to block 514 of FIG. 5 and to FIG. 11, the method 500 stacks a semiconductor substrate 1202 above the capping layer 254. In some embodiments, the two semiconductor substrates 602 and 1202 are silicon substrates. However, the disclosed structure and the method are not limiting and are extendable to other suitable semiconductor substrates and other suitable crystal orientations. For examples, either of the semiconductor substrates 602 and 1202 may include an elementary semiconductor, such as germanium; a compound semiconductor, such as silicon germanium, silicon carbide, gallium arsenic, gallium phosphide, indium phosphide, indium arsenide, and/or indium antimonide; or combinations thereof, in the same or different crystalline structures. For example, the semiconductor substrate 602 is a silicon germanium substrate and the semiconductor substrate 1202 is a silicon substrate.

In the illustrated embodiment, the stacking of the semiconductor substrate 1202 is implemented by bonding a semiconductor wafer (or die) to the capping layer 254 through a proper bonding technology, such as direct bonding, eutectic bonding, fusion bonding, diffusion bonding, anodic bonding or other suitable bonding methods. In one embodiment, the material layers are bonded together by direct silicon bonding (DSB). For example, the direct silicon bonding process may include preprocessing, pre-bonding at a lower temperature and annealing at a higher temperature. A buried silicon oxide layer (BOX) may be implemented when the two substrates are bonded together. In some examples, the semiconductor substrate 1202 may be thinned down, such as by grinding or polishing, to proper thicknesses after the bonding, such as thinning from about 700 um down to about 150 um.

Figure 12:
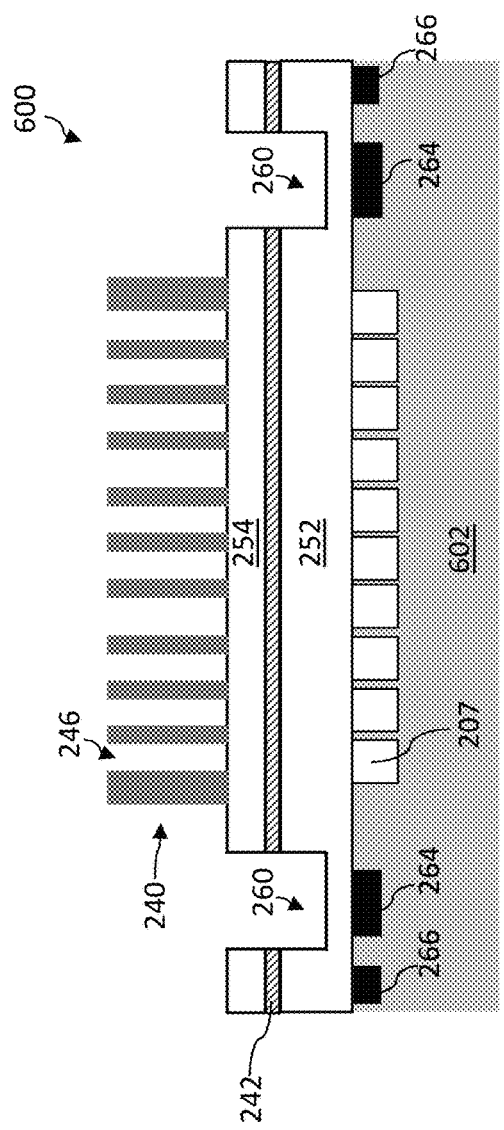

Referring to block 516 of FIG. 5 and to FIG. 12, the method 500 patterns the bonded semiconductor substrate 1202 with a plurality of apertures 246, thereby forming the collimator 240. The top surface of the capping layer 254 is partially exposed in the apertures 246. Examples of suitable aspect ratio of the apertures 246 are in a range from about 5:1 to about 50:1 and sometimes in a range from about 10:1 to about 15:1. The patterning process may also remove portions of the bonded semiconductor substrate 1202 that covers the trenches 260. The patterning process may be an etching process that includes any suitable etching technique such as wet etching, dry etching, RIE, ashing, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In the illustrated embodiment, the apertures 246 are formed by a plasma etching process. The remaining dielectric layer 252 in the trench 260 protects the bondpads 264 and other electronic components underneath from damages during the plasma bombardment.

Figure 13:
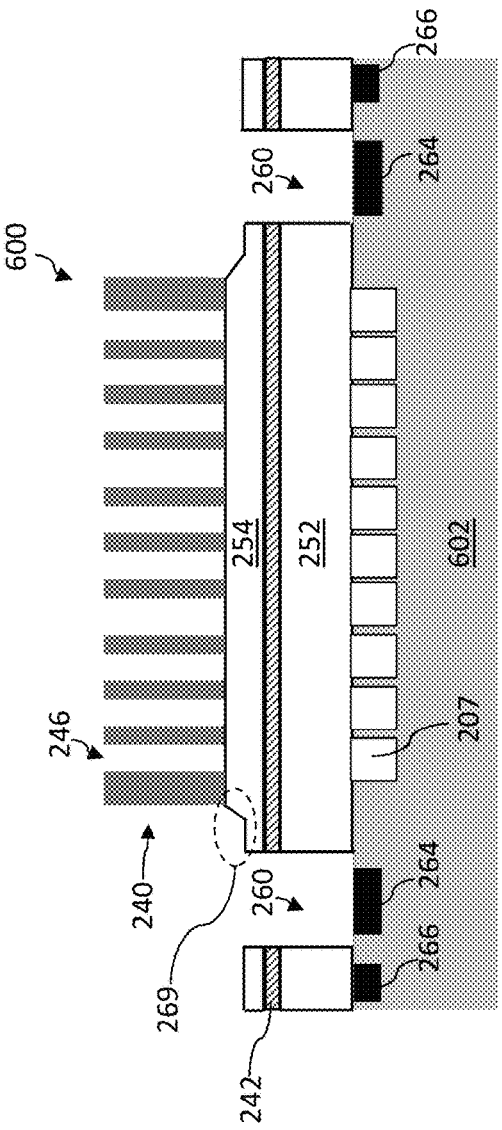

Referring to block 518 of FIG. 5 and to FIG. 13, the method 500 removes the dielectric layer 252 from the bottom of the trenches 260 and exposes the bondpads 264. The portions of the dielectric layer 252 may be removed by an etching process, such as wet etching, dry etching, Reactive Ion Etching (RIE), ashing, and/or other etching methods. Due to the etching selectivity of the selected etchant, the capping layer 254 may also have top surface etch loss during the etching process, resulting in the notched corner 269 adjacent to the collimator 240. The portions of the capping layer 254 exposed in the apertures 246 may also have some but relatively less top surface etch loss and can be regarded as substantially remaining during the etching process, which is due to the high aspect ratio of the apertures 226 and corresponding loading effects of the etchant.

Figure 14:
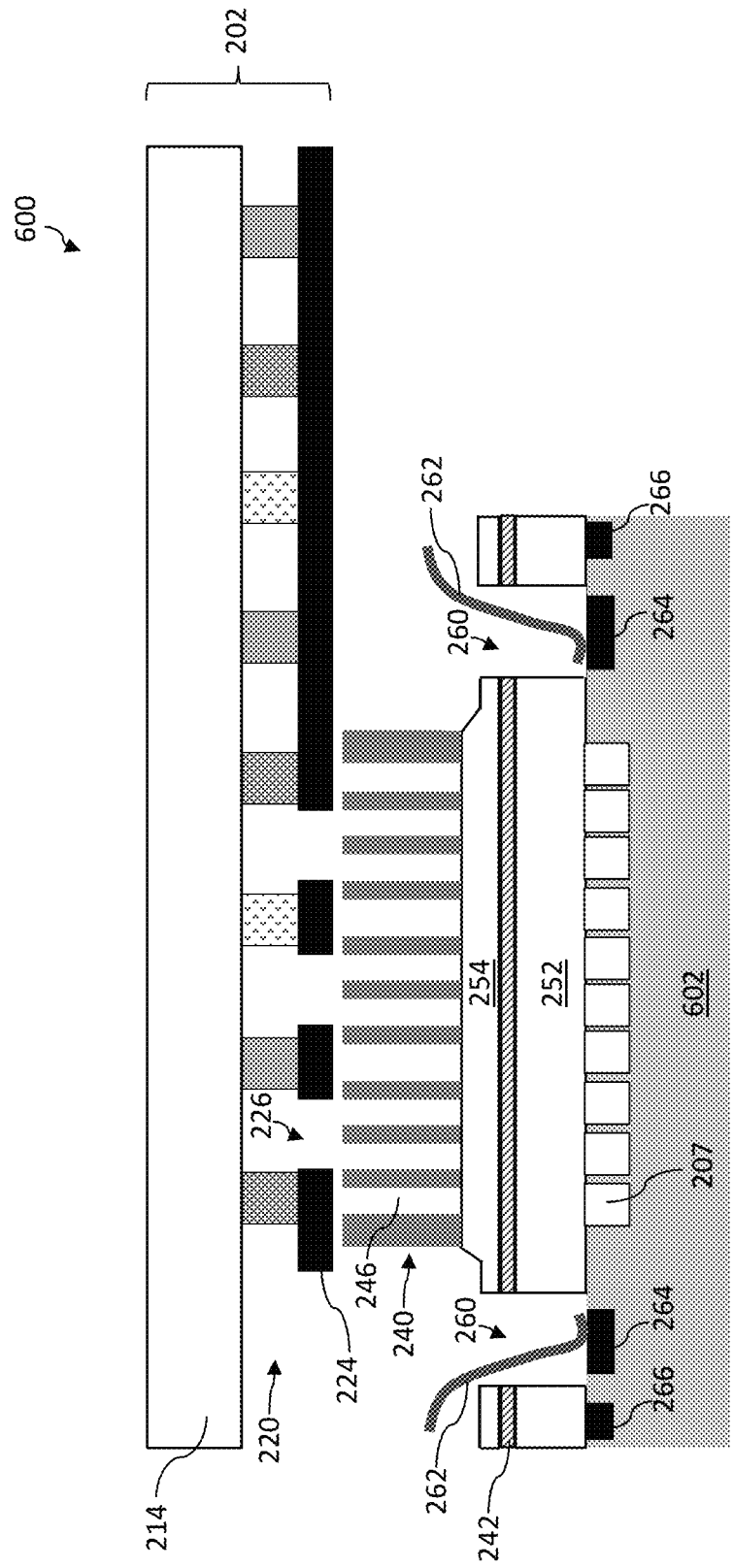

Referring to block 520 of FIG. 5 and to FIG. 14, the method 500 may proceed to further processes in order to complete the fabrication of the workpiece 600. For example, the method 500 may bond the bondpads 264 with conductive features, such as bondwires 262. The bondwires 262 extend through the openings 260 and routes internal routings in the semiconductor substrate 602 to external control signals, data lines, and power lines. The method 500 may also assemble the display panel 202 above the collimator 240. The display panel 202 may include the cover glass 214, the display layer 220, and/or the blocking layer 224.

Although not intended to be limiting, one or more embodiments of the present disclosure provide many benefits to a biometric sensing system, such as a fingerprint recognition system in a consumer (or portable) electronic devices. For example, optical signals are enhanced with higher resolution and lower noise interferences from stray light and ambient light. Fingerprint image with enhanced signal-to-noise ratio (SNR) can be acquired at image sensors. Further, the disclosed methods can be easily integrated into existing semiconductor manufacturing processes.

In one exemplary aspect, the present disclosure is directed to a sensing apparatus. In an embodiment, the sensing apparatus includes an image sensor; a collimator above the image sensor, the collimator having an array of apertures; an optical filtering layer between the collimator and the image sensor, wherein the optical filtering layer is configured to filter a portion of light transmitted through the array of apertures; and an illumination layer above the collimator. In an embodiment, the portion of light is infrared light. In an embodiment, the optical filtering layer includes metal oxide. In an embodiment, the optical filtering layer extends continuously directly under the collimator and has an opening outside of the collimator. In an embodiment, the sensing apparatus further includes a conductive feature coupled to the image sensor, the conductive feature extending through the opening. In an embodiment, the collimator is formed by bonding a wafer substrate above the optical filtering layer. In an embodiment, a ratio of a height of an aperture of the array of apertures to a diameter of the aperture is within a range of 10:1 to 15:1. In an embodiment, the illumination layer includes a plurality of light emitting pixels, a portion of the plurality of light emitting pixels is configured to illuminate an object placed above the illumination layer. In an embodiment, the array of apertures has a first pitch; the plurality of light emitting pixels having a second pitch; and the first pitch is equal to or smaller than the second pitch. In an embodiment, the illumination layer is an organic light emitting diodes (OLED) display. In an embodiment, the sensing apparatus further includes a blocking layer between the illumination layer and the collimator, wherein the blocking layer has a plurality of openings under the portion of the plurality of light emitting pixels, the opening allowing light reflected from the object to pass through.

In another exemplary aspect, the present disclosure is directed to a device. In an embodiment, the device includes a touch display panel; a light conditioning layer under the touch display panel, the light conditioning layer includes a collimator and an infrared light filter; and an image sensing layer under the light conditioning layer, the image sensing layer is configured to sense light emitted from the touch display panel. In an embodiment, a portion of the touch display panel is configured as a fingerprint sensing region. In an embodiment, the touch display panel includes a plurality of organic light emitting diodes (OLED). In an embodiment, the infrared light filter is between the touch display panel and the collimator. In an embodiment, the infrared light filter is between the collimator and the image sensing layer.

In yet another exemplary aspect, the present disclosure is directed to a method of fabricating a sensing apparatus. In an embodiment, the method includes providing a substrate, the substrate including one or more image sensors; depositing an infrared light filtering film above the substrate; bonding a semiconductor layer above the infrared light filtering film; and etching the semiconductor layer to form a plurality of apertures. In an embodiment, the etching of the semiconductor layer includes plasma etching. In an embodiment, the method further includes thinning the semiconductor layer, prior to the etching of the semiconductor layer. In an embodiment, the method further includes forming an opening in the infrared light filtering film, wherein the opening is directly above a bondpad on a top surface of the substrate; and bonding a conductive feature to the bondpad, the conductive feature extending through the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sensing apparatus, comprising:
an image sensor;
a collimator above the image sensor, the collimator having an array of apertures;
an optical filtering layer between the collimator and the image sensor, wherein the optical filtering layer is configured to filter a portion of light transmitted through the array of apertures; and
an illumination layer above the collimator, wherein the illumination layer includes a plurality of light emitting pixels, wherein a portion of the plurality of light emitting pixels is configured to illuminate an object placed above the illumination layer.

2. The sensing apparatus of claim 1, wherein the portion of light is infrared light.

3. The sensing apparatus of claim 2, wherein the optical filtering layer includes metal oxide.

4. The sensing apparatus of claim 1, wherein the optical filtering layer extends continuously directly under the collimator and has an opening outside of the collimator.

5. The sensing apparatus of claim 4, further comprising:
a conductive feature coupled to the image sensor, the conductive feature extending through the opening.

6. The sensing apparatus of claim 1, wherein the collimator is formed by bonding a wafer substrate above the optical filtering layer.

7. The sensing apparatus of claim 1, wherein a ratio of a height of an aperture of the array of apertures to a diameter of the aperture is within a range of 10:1 to 15:1.

8. The sensing apparatus of claim 1, wherein:
the array of apertures has a first pitch;
the plurality of light emitting pixels having a second pitch; and
the first pitch is equal to or smaller than the second pitch.

9. The sensing apparatus of claim 1, wherein the illumination layer is an organic light emitting diodes (OLED) display.

10. The sensing apparatus of claim 1, further comprising:
a blocking layer between the illumination layer and the collimator, wherein the blocking layer has a plurality of openings under the portion of the plurality of light emitting pixels, the opening allowing light reflected from the object to pass through.

11. A device, comprising:
a touch display panel, wherein the touch display panel includes a plurality of light emitting diodes;
a light conditioning layer under the touch display panel, wherein the light conditioning layer includes a collimator, an infrared light filter, and an anti-reflection film; and
an image sensing layer under the light conditioning layer, wherein the image sensing layer is configured to sense light emitted from the touch display panel.

12. The device of claim 11, wherein a portion of the touch display panel is configured as a fingerprint sensing region.

13. The device of claim 11, wherein the light emitting diodes are organic light emitting diodes (OLED).

14. The device of claim 11, wherein the infrared light filter is between the touch display panel and the collimator.

15. The device of claim 11, wherein the infrared light filter is between the collimator and the image sensing layer.

16. A sensing apparatus, comprising:
an image sensing layer, wherein the image sensing layer includes a plurality of optical sensing elements;
an optical filtering film above the image sensing layer;
a collimator above the optical filtering film, wherein the collimator includes a plurality of apertures;
a blocking layer above the collimator, wherein the blocking layer includes a plurality of openings; and
an illumination layer above the blocking layer, wherein the illumination layer includes a plurality of light emitting pixels.

17. The sensing apparatus of claim 16, wherein each of the plurality of apertures of the collimator is directly above at least one of the plurality of optical sensing elements of the image sensing layer.

18. The sensing apparatus of claim 16, wherein the plurality of openings of the blocking layer has an opening width smaller than a pixel distance of the plurality of light emitting pixels of the illumination layer.

19. The sensing apparatus of claim 16, wherein a portion of the plurality of light emitting pixels is capable of being configured for either display function or illumination function.

20. The device of claim 11, wherein the anti-reflection film is deposited between the infrared light filter and the image sensing layer.

* * * * *